United States Patent
Neumann et al.

[11] Patent Number: 5,846,608
[45] Date of Patent: Dec. 8, 1998

[54] PROCESS FOR ION-SUPPORTED VACUUM COATING

[75] Inventors: Manfred Neumann; Klaus Goedicke; Siegfried Schiller; Jonathan Reschke; Henry Morgner; Falk Milde; Fred Fietzke, all of Dresden, Germany

[73] Assignee: Fraunhofer-Gesellschaft Zur Forderung Der Angewandten Forschung E.V., Munich, Germany

[21] Appl. No.: 722,024

[22] PCT Filed: Apr. 7, 1995

[86] PCT No.: PCT/DE95/00476

§ 371 Date: Oct. 11, 1996

§ 102(e) Date: Oct. 11, 1996

[87] PCT Pub. No.: WO95/28508

PCT Pub. Date: Oct. 26, 1995

[30] Foreign Application Priority Data

Apr. 14, 1994 [DE] Germany ............... 44 12 906.8

[51] Int. Cl.$^6$ .................................................. C23C 14/08
[52] U.S. Cl. .................. 427/529; 427/58; 427/255.1; 427/294; 427/570; 427/576; 427/585; 427/598
[58] Field of Search ................ 427/598, 529, 427/570, 576, 58, 571, 294, 585, 255.1

[56] References Cited

U.S. PATENT DOCUMENTS

| | | | |
|---|---|---|---|
| 3,900,585 | 8/1975 | Kiyoshi | 427/13 |
| 5,242,561 | 9/1993 | Yasue | 204/192.33 |

FOREIGN PATENT DOCUMENTS 161137  2/1985  Germany .

OTHER PUBLICATIONS

Patent Abstracts of Japan, vol. 007, No. 167 (C–177), Jul. 22, 1983.
Patent Abstracts of Japan, vol. 006, No. 102 (C107), Jun. 11, 1982.
Patent Abstracts of Japan, vol. 018, No. 201 (C–1188), Apr. 8, 1994.
Patent Abstracts of Japan, vol. 012, No. 301 (C–521), Aug. 16, 1988.

*Primary Examiner*—Bernard Pianalto
*Attorney, Agent, or Firm*—Greenblum & Bernstein, P.L.C.

[57] ABSTRACT

A process an device for ion-supported vacuum coating.

The process and the affiliated device is intended to permit the high-rate coating of large-surfaced, electrically conductive and electrically insulating substrates with electrically insulating and electrically conductive coatings with relatively low expenditure. The substrates are predominantly band-shaped, in particular plastic sheets with widths of over a meter.

According to the invention, in an intrinsically known device for vacuum coating, alternating negative and positive voltage pulses are applied to the electrically conductive substrate or in electrically insulating substrates, to an electrode disposed directly behind them, e.g. the cooling roller, relative to the plasma or to an electrode that is disposed almost at plasma potential. The form, the voltage, and the duration of the pulses are adapted to the coating task and the material.

The process is used particularly for depositing abrasion protection, corrosion protection, and barrier coatings. The user is the packaging industry, among others.

11 Claims, 4 Drawing Sheets

PROCESS FOR ION-SUPPORTED VACUUM COATING

CROSS-REFERENCE TO RELATED APPLICATIONS

The present application claims the priority under 35 U.S.C. § 119 of German Patent Application No. P 44 12 906.8 filed on Apr. 14, 1994.

BACKGROUND OF THE INVENTION

1. Field of the Invention

The invention relates to a process and the affiliated device for ion-supported vacuum coating of electrically conductive or electrically insulating substrates with electrically insulating coatings and of electrically insulating substrates with electrically conductive coatings. A preferred application field is the ion-supported vacuum coating of plastic sheets with electrically insulating oxide coatings. The depositing of abrasion protection coatings and corrosion protection coatings as well as barrier coatings for packaging purposes is of particular significance.

2. Discussion of Background Information

It is known that ion-supported vacuum coating can produce a higher packing density and therefore a greater hardness and improved barrier properties of the growing coating.

One variant of ion-supported vacuum coating is comprised in disposing an ion source in the coating chamber in addition to the coating source so that the substrate is struck by the atoms or molecules of the coating material at the same time as being struck by inert case ions or reactive gas ions. As a result of the ion bombardment, loose coating components are removed from the coating surface or moved to positions that are more favorable from an energy standpoint by means of impact processes. When depositing coatings made of chemical compounds, e.g. oxides, bombardment with reactive gases, e.g. with oxygen ions, can improve the stoichiometry of the coatings in addition to the packing density. When coating electrically insulating substrates or when depositing electrically insulating coatings, it is necessary to neutralize the ion beam by adding electrons so that the coating does not become electrically charged. To this end, the ion sources are equipped with suitable neutralizing agents.

The previously available ion sources are unsuitable for ion-supported coating with high coating rates of the kind required for example for coating plastic sheets or metal band in band coating devices. On the one hand, the high ion flows adapted to the high coating rates cannot be produced at a justifiable expense. On the other hand, the maintenance-free service life of the ion sources does not correspond to the requirements of industrial application because of the high vapor densities and the attendant high soiling rates.

It is also known to realize the ion-supported coating without using separate ion sources in order to prevent these disadvantages. To this end, ions are produced between the coating source and the substrate by various means and are accelerated at the substrate by applying a negative bias voltage to it. The production of ions can be carried out by a self-maintained or non-self-maintained glow discharge, an arc discharge, or—when coating by means of high-rate atomizing—a magnetron discharge. The acceleration of ions onto the substrate by means of applying a negative bias voltage, though, is only possible when depositing electrically conductive coatings on electrically conductive substrates (Vakuum-beschichtung [Vacuum Coating], Vol. 4, G. Kienel, VDI-Verlag Düsseldorf, 1993, p. 33).

It is known that insulating substrates or insulating coatings charge by themselves to a slight negative bias voltage on the order of −10 V when a high-density plasma is produced in the immediate vicinity of the substrate surface. This so-called self bias voltage and the resultant ion energies, though, are too slight to produce the desired structural improvement and in particular, the increased packing density of the deposited coating.

When coating insulating substrates or when depositing insulating coatings, it is furthermore known to increase this self bias voltage by virtue of the fact that a high-frequency electrical alternating field is brought into effect perpendicular to the substrate surface. Above the so-called cutoff frequency, which is situated at a few megahertz depending upon the geometry and alternating field amplitude, the electrons of the plasma are excited to intensive oscillations while the ions cannot follow the high frequency due to their greater mass. The result is an increased ionization of the plasma and a negative charging of the substrate or coating surface, which charging depends on the geometry and alternating field amplitude. Normally, this high-frequency excitation is carried out at the frequency of 13.56 MHz, which is cleared for industrial applications.

The use of this kind of high frequencies, though, is connected with considerable technical expense and therefore is limited to relatively small substrate areas for economical reasons. Typical uses are the coating of optical components and electronic elements. The transmission of high-frequency output requires matching networks whose loss power sharply increases with the capacity of the high-frequency electrodes, i.e. with the substrate size. When coating plastic sheets, for example the entire cooling roller via which the sheet is guided during coating must be embodied as a high-frequency electrode. With coating widths on the order of one meter or more, the required expenditure for the high-frequency generator and matching network is no longer economically justifiable.

Finally, ion-supported coating of substrates, which are electrically non-conductive or poorly conductive, is also known. To that end, electrodes that are connected to alternating current are disposed in the plasma chamber between the vapor source and the substrate to be coated. The frequency of this alternating current lies between a few kHz and a few hundred kHz, wherein there is a voltage of +250 V in relation to the plasma potential of −800 V. In the process, the glow cathode constantly and uniformly emits electrons (DD 161 137 A 3). This process and the affiliated device have the disadvantage that the coatings produced have only a low packing density so that the quality of the coatings, particularly on plastic sheets, does not correspond to the high demands that are placed on corrosion protection coatings and barrier coatings. Furthermore, the cost of producing high frequencies is relatively high.

SUMMARY OF THE INVENTION

The object of the invention is to find a process and a device for ion-supported vacuum coating, which permits the high-rate coating of large-surfaced electrically conductive or electrically insulating substrates with electrically insulating coatings and electrically insulating substrates with electrically conductive coatings, with an economically justifiable expenditure that is as low as possible. In particular, plastic sheets or other band-shaped materials with a width of over a meter can be coated at a reasonable price. The equipment expenditure of the device should not significantly exceed that which is otherwise normal.

Accordingly, the present invention may be directed to a process for ion-supported vacuum coating, for a high-rate coating of a substrate including at least one of a large-surfaced, electrically conductive or electrically insulating substrate with an electrically insulated coating and of an electrically insulating substrate with an electrically conductive coating, in which a plasma is produced between a coating source and the substrate to accelerate ions toward the substrate. The method may include applying alternating negative and positive voltage pulses, relative to a plasma potential, to one of the electrically conductive substrate and an electrode disposed directly behind the electrically insulating substrate and extending over an entire coating surface. A duration of the negative voltage pulses may correspond to a charging time of capacitor formed by at least one of the electrically insulated coating and the electrically insulating substrate, and the method may further include choosing a duration of the positive voltage pulses to be equal to or less than the duration of the negative voltage pulses. The positive and negative voltage pulses may follow one another in direct succession and may be set at virtually a same level relative to the plasma potential, and the level of the positive and negative voltage pulses, relative to the plasma potential, may be approximately between ±20 to ±2000 V.

In accordance with another feature of the present invention, the method may further include adjusting the duration of the negative voltage pulses to between approximately 1 ms to 10 μs when at least one of an insulating coating thickness and substrate thickness is between approximately 1 μm to 100 μm.

In accordance with still another feature of the present invention, the method may further include applying rectangular voltage pulses to one of the electrically conductive substrate or the electrode behind the electrically insulating substrate. The method may also include selecting a large rise time of the positive voltage pulses and a large fall time of the negative voltage pulses so that surface potential of deposited coating is not increased at any point in time more than 20 V positive relative to the plasma potential, and selecting a small rise time of the negative voltage pulses and a small fall time of the positive voltage pulses so that the surface potential of the deposited coating is increased for a short time to a negative value of at least 50 percent a doubled pulse level relative to the plasma potential.

In accordance with yet another feature of the present invention, the method may include applying sine-shaped voltage pulses to one of the electrically conductive substrate and the electrode behind the electrically insulating substrate, and adjusting the durations of the positive and negative voltage pulses to be equal in length.

In accordance with still another feature of the present invention, the method may include utilizing an electron beam evaporator as a coating source, and producing the plasma by ionizing vapor and residual gas with an electron beam and backscattering the electrons at the evaporating material.

In accordance with a further feature of the present invention, the method may include utilizing at least one arbitrarily heated evaporator as a coating source, and producing the plasma by low-voltage arc discharges in the region between the at least one arbitrarily heated evaporator and substrate.

In accordance with another feature of the present invention, the method may include utilizing at least one resistance-heated boat evaporator as the coating source, and producing the plasma by hollow-cathode arc discharges in the region between the at least one evaporator and the substrate.

In accordance with yet another feature of the present invention, the method may include utilizing at least one arbitrarily heated evaporator as the coating source, and producing the plasma by a magnetron discharge between two magnetrons which burn counter to each other with a chronologically alternating polarity.

In accordance with still another feature of the present invention, the method may include utilizing at least one atomizing source as a coating source, the at least one atomizing source simultaneously producing the plasma.

In accordance with a further feature of the present invention, the level of the positive and negative voltage pulses, relative to the plasma potential, may be approximately between ±50 to ±500 V.

In accordance with another feature of the present invention, the method may also include choosing the duration of the positive pulses such that the duration of the negative pulses are approximately 2 to 10 times greater than the chosen duration of the positive pulses.

The present invention may be directed to a device for ion-supported vacuum coating and for providing a high-rate coating of a substrate, the substrate including one of a large-surfaced, electrically conductive or electrically insulating substrate with an electrically insulated coating and of an electrically insulating substrate with an electrically conductive coating. The device may include at least one coating source, a device for securing or guiding the substrate, a device for producing a plasma, and a voltage source, producing voltage pulses, and including a first and second pole. The first pole may be coupled to one of the electrically conductive substrate and an electrode disposed directly behind the electrically insulating substrate, and the second pole may be coupled for receiving substantially a plasma potential.

In accordance with another feature of the present invention, the substrate may further include band-shaped, electrically insulating substrates, and the electrode may include a cooling roller insulated against ground potential.

In accordance with still another feature of the present invention, the coating source may include an electron beam evaporator and a plasma confining field positioned between the evaporating material and the substrate for deflecting backscattered electrons. The plasma confining field may include first and second plasma electrodes which are maintained almost at the plasma potential.

In accordance with yet another feature of the present invention, the device may further include low-voltage arc sources, including hollow-cathode arc sources and at least one anode, positioned between the coating source and the substrate. The at least one anode may include the second pole at substantially the plasma potential.

In accordance with a further feature of the present invention, the device may further include a plurality of adjacent alternating current-heated boat evaporators longitudinally positioned in a direction of substrate transport, and a hollow-cathode arc source, including a hollow-cathode arc essentially extending in a longitudinal direction of the plurality of alternating current-heated boat evaporator, positioned above the plurality of alternating current-heated boat evaporators.

In accordance with a still further feature of the present invention, the device may also include a magnetic deflection system associated with each hollow-cathode arc source for horizontal alternating deflection of the hollow-cathode arcs.

In accordance with still another feature of the present invention, the device may further include at least two magnetrons arranged to burn counter to each other and with polarity that alternates at a predetermined period and to be insulated against ground potential. The at least two magnetrons may be disposed between the coating source and the substrate to produce the plasma, and the voltage source may be coupled to both of the magnetrons.

In accordance with yet another feature of the present invention, the device may further include one of the at least two magnetrons coupled to the one of the electrically conductive substrate and the electrode disposed directly behind the electrically insulating substrate.

In accordance with another feature of the present invention, the voltage source may include two voltage sources connected in series, operating in a synchronous manner, and working in a same direction, and may further include a voltage tap positioned between the at least two magnetrons, and coupled with the one of the electrically conductive substrate or to the electrode disposed directly behind the electrically insulating substrate.

In accordance with yet another feature of the present invention, the voltage source may be coupled to at least two series connected electric resistors of equal size, and the one of the electrically conductive substrate and the electrode disposed directly behind the electrically insulating substrate may be coupled to a connection point between the at least two series connected resistors.

In accordance with still another feature of the present invention, the coating source may include at least one magnetron atomizing source, and each at least one magnetron atomizing source may be disposed for the simultaneous production of the plasma.

In accordance with another feature of the present invention, the at least one the magnetron atomizing source may include one of reactively driven d.c. magnetrons and high-frequency magnetrons.

In accordance with yet another feature of the present invention, the at least one the magnetron atomizing source may include two magnetrons arranged to burn counter to each other with alternating polarity and the voltage source further for coupling to the at least two magnetron atomizing source.

The acceleration of ions from the plasma, which is produced between the coating source and substrate, toward the insulating substrate or the insulating coating can also be carried out without the self bias production by means of an expensive high-frequency field if alternating negative and positive voltage pulses relative to the plasma potential are applied to the substrate in the case of conductive substrates or to an electrode disposed directly behind the substrate in the case of insulating substrates and the duration of the pulses is adapted to the charging time of the capacitor, which is constituted by the insulating coating or the insulating substrate. The voltage pulses applied to the back side of the insulating coating or the insulating substrate are transmitted as in a capacitor, to the surface of the insulating coating or of the insulating substrate, which surface is oriented toward the plasma, as long as no current flow of plasma onto this surface occurs. As a result, a negative and a positive bias voltage are alternatingly produced on the insulating surface of the substrate or the coating, which surface is oriented toward the plasma. During the negative voltage pulse, positive ions are accelerated out of the plasma onto the surface of the substrate or coating and during the positive voltage pulse, electrons are accelerated out of the plasma onto this surface. As a result of the attendant ion or electron flow, though, after a short time, the capacitor constituted by the insulating substrate and/or the insulating coating becomes charged. The surface oriented toward the plasma then assumes the plasma potential and no further ions or electrons can be withdrawn from the plasma. Because of the alternation of negative and positive voltage pulses which adjoin in direct succession and whose length is adapted to the charging time of the capacitor constituted by the insulating substrate and/or the insulating coating, a succession of directly connected ion and electron flows to the substrate or coating surface are obtained. At the same time, it has turned out that with plasma densities of approx. $10^{10}$ cm$^{-3}$, the duration of negative pulses should be on the order of 1 ms for insulating coating thicknesses or substrate thicknesses of approx. 1 $\mu$m and should be on the order of 10 $\mu$s for insulating coating thicknesses or substrate thicknesses of approx. 100 $\mu$m. The duration of positive pulses can be shorter than the duration of negative pulses because of the higher mobility of electrons in comparison to ions. A duration of the positive pulses that is lesser by a factor of 2 to 10 can be sufficiently realized with regard to the time requirements and can be realized with relative ease as regards the technical expenditure.

As a result, suitable pulse train frequencies of approx. 1 kHz for approx. 1 $\mu$m thick insulating coatings on conductive substrates or of approx. 100 kHz for insulating or conductive coatings on insulating substrates that are approx. 100 $\mu$m thick. In contrast to the known high-frequency excitation at 13.56 MHz, frequencies of this kind can be produced with much less expensive generators and without costly adapters. Another advantage of the process according to the invention, with alternating positive and negative bias voltage in the middle frequency range in comparison to the continuous, negative self bias voltage with high-frequency excitation is comprised in that voltage punctures and microarcs that can occur for bias voltages greater than 1000 V, in particular with thin insulating coatings or thin insulating substrates, do not occur or drop into the non-critical range because of the polarity reversal in the middle frequency range.

It is suitable for the carrying out of the process according to the invention to use rectangular voltage pulses, wherein the rise times and fall times of the pulses are intended to be optimally adapted to the process by means of corresponding wiring. The fall time of the negative pulses and the rise time of the positive pulses connected to them should be selected of such a size that the surface potential of the insulating coating is not increased at any point in time by more than 20 V positive in comparison to the plasma potential. This is achieved if the positive voltage increase is adjusted at a speed less than or equal to the negative charging of the insulating coating surface by electrons from the plasma. Because of this measure, it is achieved that the electrons are accelerated with as low as possible a bias voltage and the substrate is not unnecessarily loaded with additional energy. On the other hand, the fall time of the positive pulses and the rise time of the negative pulses connected to them should be as short as possible so that the desired negative bias voltage is achieved on the substrate or coating surface and is not ever reduced during the negative voltage increase by means of the ion flow from the plasma. The higher the particle density of the plasma and therefore the higher the ion flow onto the substrate or coating surface, the more rapidly the negative voltage increase must occur.

In applications with lower plasma density, a slower negative voltage increase is permissible and instead of the rectangular voltage pulses, sine-shaped voltage pulses are used which are cheaper to produce. In the course of this, the frequency must be chosen as high so that sufficiently high negative bias pulses are achieved on the substrate or coating surface.

A particularly advantageous use of the process according to the invention is comprised in the ion-supported coating of conductive substrates with thin insulating coatings. Thin insulating coatings up to the thickness of a few $\mu$m constitute a capacitor, which has high capacity and high charging time, between the conductive substrate and the plasma and therefore require only relatively small and inexpensive to produce pulse train frequencies. Furthermore, with ion-supported coating with high-frequency excitation, thin insulating coatings are very prone to voltage punctures and micro-light arcs so that the use of the process according to the invention represents almost the only possibility for a stable and low-defect ion-supported coating.

Another advantageous use of the process ensues in the ion-supported coating of thin plastic sheets with insulating or conductive coatings. Plastic sheets coated in this way are required for example as barrier sheets in the packaging industry and require minimal manufacture costs. The thicknesses of plastic sheets that are of interest in this connection are 10–20 $\mu$m so that even in this case, the process according to the invention can be used with relatively low pulse train frequencies.

A particularly favorable embodiment of the process according to the invention ensues if an electron beam evaporator is used as the coating source. In this case, a plasma is already produced by the electron beam and by backscattered electrons, and a separate plasma source is often unnecessary.

However, higher plasma densities are required for depositing particularly high-quality coatings or for the achievement of particularly high coating rates. In this case, it is suitable to produce the requisite high plasma densities by means of low voltage arc discharges, in particular by means of hollow-cathode arc discharges. In contrast, if a high homogeneity of the coating must be achieved over large coating widths, then it is advantageous to produce the plasma by means of an intrinsically known magnetron discharge between two pulse magnetrons that burn counter to each other with polarity that chronologically alternates.

A particularly advantageous solution ensues if the coating occurs by itself or in addition to the atomization by means of one or a number of atomizing sources. In this case, a separate plasma source is not required and through the combination of the coating by atomization with the alternating middle frequency pulse bias according to the invention, particularly high-quality coatings are obtained. Reactively operated d.c. magnetrons or high-frequency magnetrons are regarded as atomizing sources. Particularly low-defect coatings are obtained with the use of the above-mentioned pulse magnetron as a coating source.

The most suitable device for carrying out the process according to the invention is an intrinsically known vacuum coating device that is equipped with a coating source, a substrate retainer or guide device, and means for producing a plasma. Additionally, a voltage source is required for producing voltage pulses of alternating polarity with pulse levels between ±20 V and ±2000 V and pulse durations between 1 $\mu$s and 1000 $\mu$s. One pole of this voltage source is connected to an electrode that is disposed approximately at plasma potential; in the case of conductive substrates, the other pole is connected to the substrate, which is insulated from the plasma, and in the case of an insulating substrate, this other pole is connected to an electrode that is disposed directly behind the substrate and extends over the entire coating area.

With the coating of thin insulating plastic sheets, the cooling roller that is usually provided to guide and cool the plastic sheet in the coating zone can be used as an electrode disposed directly behind the substrate. However, then this cooling roller, in contrast to conventional sheet coating devices, must be insulated against ground potential and if need be, must be provided with shields that guard against the ignition of parasitic glow discharges.

In devices with electron beam evaporators as the coating source, it is useful to dispose an intrinsically known plasma confining field between the evaporating material and the substrate. As a result, the backscattered electrons on the evaporating material are forced into circular paths so that their path and therefore their ionization probability in vapor and residual gas is increased and also a plasma density that is sufficient for the process according to the invention is achieved without an additional plasma source.

For the production of particularly high ion flow densities on the substrate, it is useful to dispose low-voltage arc sources as additional plasma sources between the coating source and the substrate. Hollow-cathode arc sources are particularly suitable. When using alternating current-heated evaporator boats as a coating source in connection with hollow-cathode arc sources, a lateral, alternating deflection of the hollow-cathode arcs by means of the magnetic stray fields of the alternating current-heated evaporator boats turns out to be a particular advantage. This is especially true when using an intrinsically known magnetic guide field parallel to the hollow-cathode arcs. As a result, a higher uniformity of the plasma is achieved crosswise to the hollow-cathode arcs.

Another increase in uniformity, particularly when using only one hollow-cathode arc source for a number of boat evaporators, is achieved by disposing intrinsically known magnetic deflection systems on the hollow-cathode arc sources, which systems carry out an additional horizontal, alternating deflection of the hollow-cathode arcs.

Another embodiment of the device according to the invention ensues with the use of two pulse magnetrons, which have laterally alternating polarity, as plasma sources. In this case, the pulse voltage source for the two pulse magnetrons can be used at the same time as a voltage source for the pulse bias voltage according to the invention. The simplest solution is comprised in producing an electrical connection between one of the two pulse magnetrons and the substrate or the electrode disposed directly behind the substrate. Since the plasma potential changes periodically relative to each of the two pulse magnetrons in accordance with the applied pulse voltage, the same periodic pulse voltage is also obtained between the plasma and the substrate. If the magnetron connected to the substrate receives a positive pulse, then electrons are accelerated from the plasma to the substrate. If it receives a negative pulse, then ions are accelerated to the substrate.

Another variant is comprised in that the pulse voltage source is comprised of two voltage sources, which are connected in series, operate in a synchronous manner, and work in the same direction, and that a voltage tap is provided between these two pulse generators, which is connected to the substrate or to the electrode disposed directly behind the substrate. In comparison to the variant mentioned at the beginning, in this case, with the same magnetron pulse voltage, only half the pulse voltage is obtained between the plasma and substrate. Whenever the maximum of the positive pulse voltage is achieved at one of the two magnetrons, ions are accelerated from the plasma to the substrate. During the pole reversal of the two magnetrons, the plasma potential shifts in the negative direction for a short time so that an electron current flows for a short time onto the substrate. A similar variant ensues if only one pulse voltage source is provided for the two pulse magnetrons and the two outputs of the pulse voltage source are connected via electric resistors of equal size to the substrate or the electrode disposed directly behind the substrate. In this case, the same potential ratios are obtained as in the above-mentioned case, but only one pulse voltage source is required in all.

A similar embodiment of the device according to the invention ensues with the use of atomizing sources as the sole coating source or in addition to arbitrarily heated evaporator sources. In this case, the atomizing sources are simultaneously used as a coating source and a plasma source. With the use of d.c. magnetrons or high-frequency magnetrons as atomizing sources, separate voltage sources are used for the operation of the magnetron and the production of the voltage pulses between the plasma and the substrate. In the course of this, the targets of the magnetron, which are electrically connected to one another, are used as electrodes disposed almost at plasma potential. With the use of pulse magnetrons as atomizing sources, the pulse voltage source for the pulse magnetron can be used simultaneously as the pulse voltage source for producing the voltage pulses between the plasma and the substrate. At the same time, the same variants can be used which were described as the plasma source in the use of pulse magnetrons.

BRIEF DESCRIPTION OF THE DRAWINGS

The invention is explained in detail in conjunction with several exemplary embodiments. In the accompanying drawings.

DETAILED DESCRIPTION OF THE PREFERRED EMBODIMENT

Figure 1:
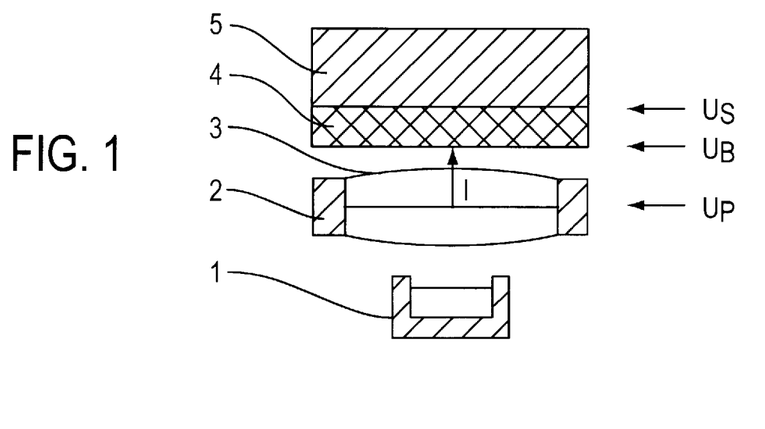
FIG. 1 shows schematic representation of a device for carrying out the process.

FIG. 1 shows a device for carrying out the process, having a coating source 1, a plasma source 2, the plasma 3 produced, an insulating coating 4, and a conductive substrate 5. A capacitor is embodied as a dialectric via the insulating coating 4. The upper end of the insulating coating 4 charges up to the potential $U_S$ via the conductive substrate 5 and the lower end of the insulating coating 4 charges up to the potential $U_B$ via the plasma 3. In the process, the current I flows from the plasma 3 onto the underside of the insulating coating 4. Because of the direct contact between the conductive substrate 5 and the insulating coating 4, $U_S$ agrees with the potential of the conductive substrate 5, while the potential $U_B$ differs from the potential $U_P$ of the plasma on the underside of the insulating coating 4.

Figure 2:
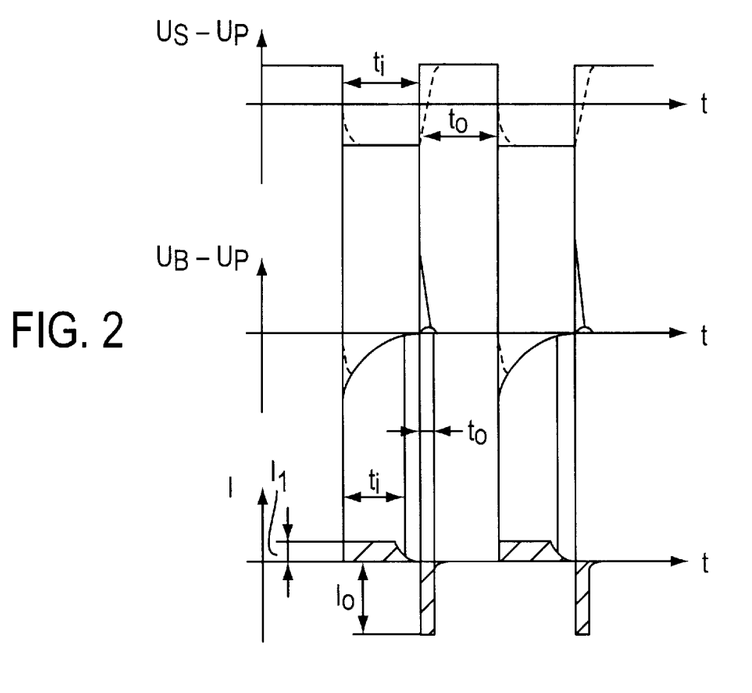
FIG. 2 shows a chronological course of the potentials and currents as the process is carried out.

In principle, FIG. 2 shows the chronological course of potentials $U_S$ and $U_B$ relative to the plasma potential $U_P$ as well as the course of the current I if during the time $t_+$, a positive voltage is applied to the conductive substrate 5 and during the time $t_-$, a negative voltage is applied, which voltage applications occur in an alternating fashion. The potential $U_S$ directly follows the voltage applied to the conductive substrate 5. In contrast, due to the capacitor function of the insulating coating 4, the potential $U_B$ actually follows the rapid voltage jumps, but then as a result of the charge carrying current $I_B$ from the plasma 3, falls very rapidly until almost at the plasma potential. This drop of the potential $U_B$ occurs more rapidly the higher the current I from the plasma is. After negative voltage jumps, a current $I_i$ of positive ions is drawn from the plasma 3 onto the surface of the insulating coating 4, and after positive voltage jumps, a current $I_e$ of negative electrons is drawn from the plasma 3 onto this surface. Due to the higher mobility of electrons, the negative electron current $I_e$ is considerably greater than the positive ion current $I_i$. Accordingly, the time $t_e$ for charging the capacitor by means of the electron current $I_e$ is shorter than the time $t_i$ for charging by means of the ion current $I_i$. Since in the chronological middle, no charge of the insulating surface can be discharged, then the following equation is true:

$$I_i \cdot t_i = I_e \cdot t_e.$$

In order to shoot the greatest possible number of ions onto the surface of the insulating coating 4, it is suitable to adapt the time durations $t_-$ and $t_+$ of the voltage pulses to the charging times $t_i$ and $t_e$ of the capacitor constituted by the insulating coating 4:

$$t_- \approx t_i;\ t_+ \approx t_e$$

Furthermore, it is useful that the negative voltage changes of $U_S$ (shown in FIG. 2 as a dashed line) occur much faster than the charge time $t_i$ of the insulating coating 4 by means of positive ions and that the positive voltage changes of $U_S$ occur at a speed less than or equal to the charging time $t_e$ of the insulating coating 4 by means of electrons. As a result, it is achieved that the level of the negative voltage pulses $U_B$ on the underside of the insulating coating 4, which is used as a bias voltage for the ions extracted from the plasma 3 is only reduced by an insignificant amount. In contrast, the relatively slow increase of the positive pulses leads to the fact that the voltage drop occurs at greater than or equal to the speed of the voltage increase influenced by the conductive substrate 5. The result is that the positive potential $U_B$ on the underside of the insulating coating 4 is not significantly increased over the plasma potential $U_P$ so that the electrons withdrawn from the plasma 3 do not transmit any impermissibly high energy to the coating 4 and the substrate 5. This is particularly important in the coating of temperature sensitive substrates 5 such as plastic sheets.

Figure 3:
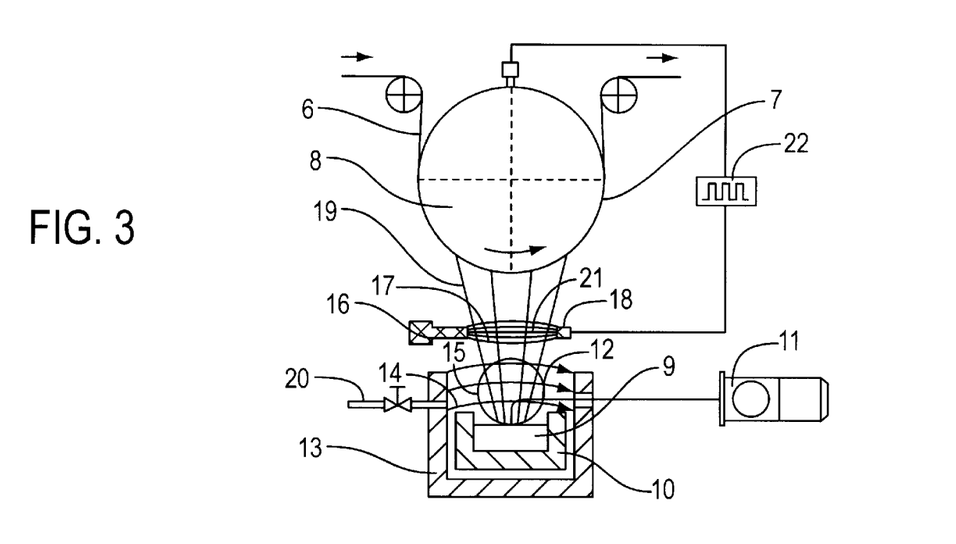
FIG. 3 shows a device for coating plastic sheets, having an electron beam evaporator as a coating source and a hollow-cathode arc source as a plasma source.

FIG. 3 shows a device for carrying out the process for coating plastic sheets by means of ion-supported electron beam evaporation of aluminum oxide. A 10 μm thick, electrically insulating plastic sheet 6 (polyester sheet) is vacuum coated with a 0.05 μm thick, electrically insulating oxide coating 7, while it is conveyed in a known manner in the vacuum via a cooling roller 8 cooled to approx. −20° C. The aluminum oxide 9 is evaporated from a water-cooled crucible 10 by means of an electron beam 12 produced in an electron cannon 11. The electrons backscattered on the aluminum oxide 9 are deflected by means of a magnetic field 14 produced in a plasma confining field 13 and in this way, are prevented from striking and heating up the oxide coating 7 and the plastic sheet 6. Because of the ionizing effect of these backscattered electrons, a plasma 15 of lower density is produced between the crucible 10 and the plastic sheet 6 to be vacuum coated. For the production of higher plasma densities, a cathode 16 of a hollow-cathode arc source is disposed above the plasma confining field 13. The low-voltage electron beam 17 thus produced is conveyed by means of the boundary field lines of the magnetic field 14 to the anode 18 of the hollow-cathode arc source. The vapor stream 19 of the evaporated aluminum oxide and the oxygen admitted via a gas admission system 20 are excited, ionized, and dissociated by means of the low-voltage electron beam 17 so that a high-density plasma 21 is produced beneath the plastic sheet 6 to be vacuum coated. Between the anode 18, which is disposed virtually at plasma potential, and the cooling roller 8, which is insulated against ground potential and acts as an electrode directly behind the insulating plastic sheet 8, a voltage source 22 is disposed for producing rectangular voltage pulses of alternating polarity. During the negative pulses at a level of approx. 200 V and approx. 20 $\mu$s duration, ions from the high-density plasma 21 are accelerated onto the plastic sheet 6 or the growing oxide coating 7 in addition to the likewise accelerated, partially ionized and excited vapor and oxygen atoms in the plasma. During the directly succeeding positive pulse likewise at a level of approx 200 V, but only approx. 5 $\mu$s duration, electrons are accelerated from the high-density plasma 21 onto the plastic sheet 6 or the oxide coating 7. The aluminum oxide coating deposited in this manner has a high optical transparency and a high packing density and is particularly suited as a barrier coating for high-quality packaging sheets.

Figure 4:
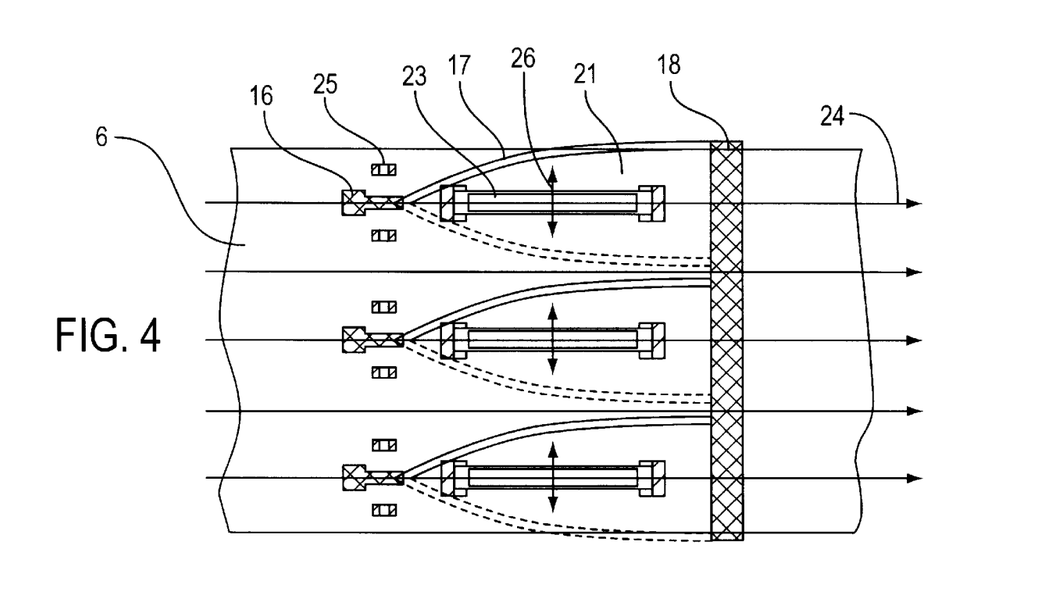
FIG. 4 shows a top view of a device for coating plastic sheets, having boat evaporators as a coating source and hollow-cathode arc sources as plasma sources.

FIG. 4 shows a top view of the section of a device for carrying out the process for the ion-supported coating of plastic sheets with aluminum oxide by means of reactive evaporation of aluminum. A series of alternating current-heated boat evaporators 23 disposed next to one another, which are aligned in the transport direction of the plastic sheet 6, are used as the coating source. (Approximately 15 boat evaporators are disposed next to one another for coating 1.50 m wide sheets.) Hollow-cathode arc sources, which are comprised of hollow cathodes 16 and a common anode 18, are in turn disposed between the boat evaporators 23 and the plastic sheet 6 for the production of a high-density plasma 21. The low-voltage electron beams 17 produced at the hollow cathodes 16 are conveyed by means of a magnetic field 24 running in the transport direction of the plastic sheet 6 and are deflected lateral to the transport direction of the plastic sheet 6 by the deflection system 25 in the vicinity of the hollow cathodes 16 in order to produce an even distribution of the plasma over the entire width of the plastic sheet 6. In addition, to heat the boat evaporators 23, the alternating currents produce annular magnetic fields 26, which run around the boat evaporators 23 and superpose the field intensity of the magnetic field 24 and as a result, lead to an additional lateral deflection of the low-voltage electron beams 17 and consequently to a further homogenizing of the plasma 21. Analogous to FIG. 3, voltage pulses of alternating polarity are applied between the anode 18, which is disposed approx. at plasma potential, and the cooling roller 8, which is not shown, but is disposed above the coating source to convey the plastic sheet 6, likewise analogous to FIG. 3, in order to alternatingly shoot ions and electrons from the plasma onto the growing coating 7.

Figure 5:
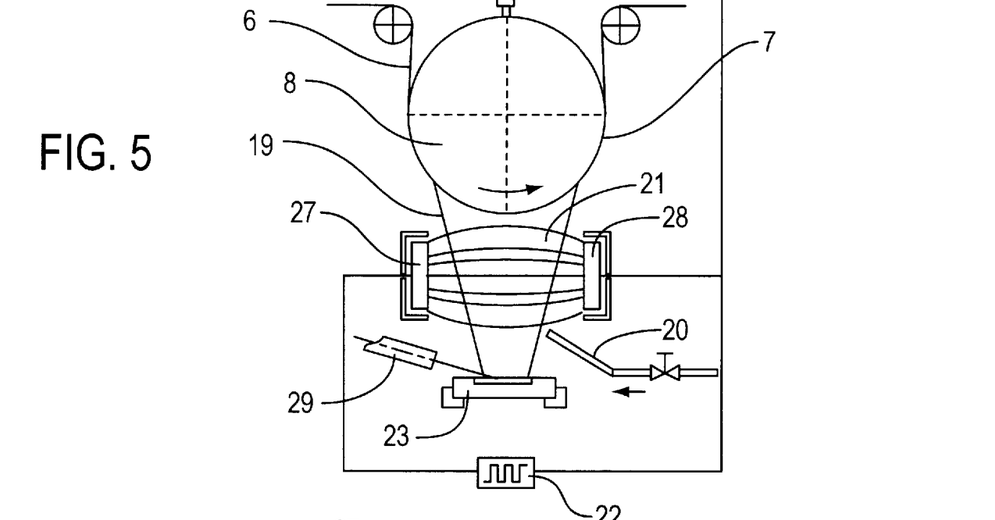
FIG. 5 shows a device for coating plastic sheets, having boat evaporators as a coating source and pulse magnetrons as a plasma source.

FIG. 5 shows another device for carrying out the process, likewise with boat evaporators 23 as a coating source, but with two magnetrons 27, 28 driven in pulse fashion to produce plasma 21 for the ion-supported coating. Negative potential (cathode) is applied to one magnetron 27 and positive potential (anode) is applied to the other magnetron 28, respectively, with chronologically alternating polarity by means of the voltage source 22. One of the two magnetrons 27; 28, for example the magnetron 28, is connected to the cooling roller 8, which is insulated against ground potential and disposed behind the plastic sheet 6. As a result, when there is negative potential of magnetron 28 in comparison to magnetron 27, ions are accelerated from the plasma 21 onto the growing coating 7 on the plastic sheet 6 and when there is positive potential of the magnetron 28 in comparison to magnetron 27, electrons are accelerated from the plasma 21 onto this coating, in a chronologically alternating fashion. In this manner, with operation of both magnetrons 27, 28 in inert gas with no percentage of reactive gas, a pure metal coating with a high packing density and a low electrical resistance is deposited. With the aid of the wire feeding device 29 and with the use of correspondingly suitable boat evaporators 23, virtually all metals that are available in wire form, including metal alloys, can be vaporized. With the additional admission of a reactive gas, e.g. oxygen, via the gas admission system 20, the corresponding metal compounds, e.g. metal oxides, can be deposited. As a result of the activation of the vapor stream 19 and the admitted reactive gas, when traveling through the plasma 21, stoichiometric coatings are deposited, even at high coating rates. Furthermore, by means of the ion bombardment that is carried out in pulse fashion, a particularly dense and low-defect coating can be produced, which is suited as a barrier coating for packaging sheets or as a corrosion or abrasion protection coating for the substrate or for a coating already deposited on the substrate at an earlier point. Furthermore, because of the high uniformity of the plasma 21 produced by the magnetron 27, 28 and the virtually arbitrary length of the magnetron 27, 28, highly constant coating properties can also be produced over coating widths of a number of meters.

Figure 5A:
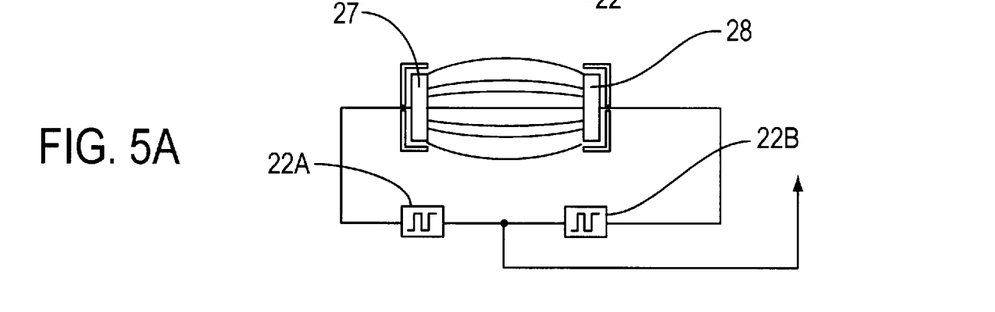
FIG. 5a shows an embodiment of the device according to FIG. 5, with two voltage sources.

FIG. 5a shows a variant of the device shown in FIG. 5, in which two voltage sources 22a and 22b, which are connected in series, operate in a synchronous manner, and work in the same direction, are used for the excitation of the two magnetrons 27, 28. In this case, the voltage tap for the electrically conductive substrate or the cooling roller 8, which is insulated against ground potential, occurs at the connecting point between the two voltage sources 22a and 22b. The advantage over the device according to FIG. 5 is comprised in that during each discharging direction of the two magnetrons 27, 28, in one, ions are accelerated from the plasma onto the plastic sheet 6 and in the other, electrons are accelerated onto this sheet, while with the device according to FIG. 5, in one discharging direction, only ions are withdrawn and in the other discharge direction, only electrons are withdrawn. However, with the same pulse voltage between the magnetrons 27, 28, only half of the pulse voltage is available between the plastic sheet 6 and the plasma.

Figure 5B:
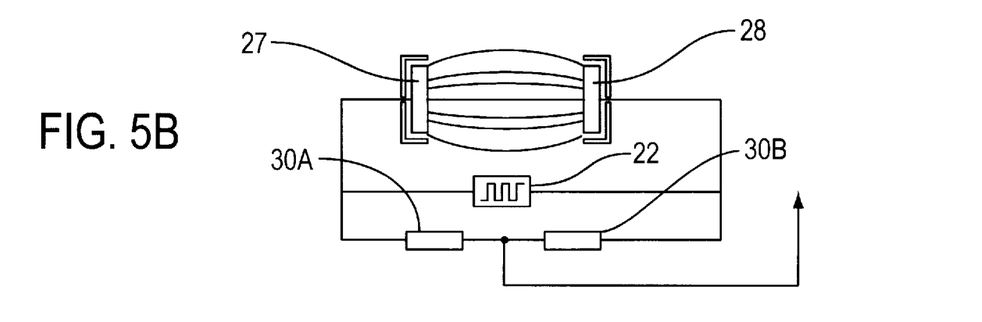
FIG. 5b shows an embodiment of the device according to FIG. 5, with a voltage divider.

The same properties are achieved with the variant according to FIG. 5b, as are achieved with the variant according to FIG. 5a. By means of a voltage divider, which is comprised of two electrical resistors 30a and 30b of equal size, and via the voltage source 22, whose center tap is connected to the substrate or to the cooling roller 8 used according to FIG. 5, only one voltage source 22 is required in comparison to the variant according to FIG. 5a. However, depending upon the pulse bias current required for the voltage divider, an additional current is required from the resistors 30a and 30b so that in comparison to the variants according to FIGS. 5 and 5a, a voltage source 22 with higher current efficiency is required.

Figure 6:
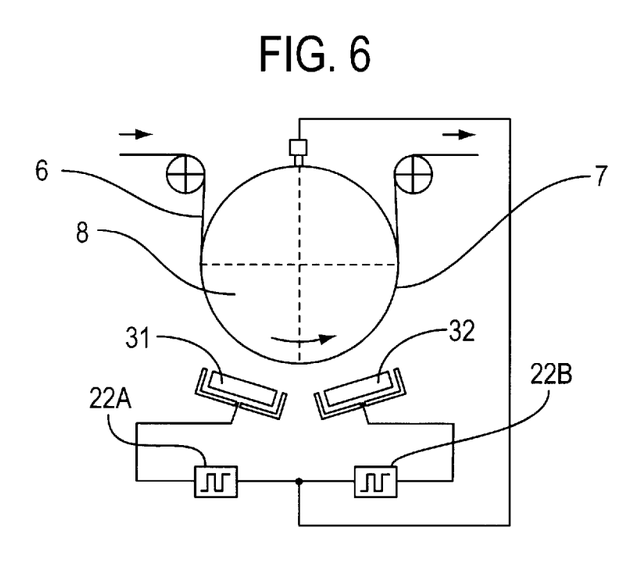
FIG. 6 shows a device for coating plastic sheets, having a plasma source and two pulse magnetrons as a coating source.

FIG. 6 shows a device for carrying out the process by using sputter sources as the coating source. Of the great number of possible variants with regard to the type and number of sputter sources, the coating is represented by means of two magnetron atomizing sources 31; 32. In particular for depositing highly insulating, low-defect coatings, superposing pulse sputtering over reactive d.c. sputtering or high-frequency sputtering is known. A further improvement of the coating properties, in particular the packing density of coatings, is possible by means of additional use of the process according to the invention. This is particularly advantageous because not only the voltage source 22a; 22b of the magnetron atomizing sources 31; 32, but also the plasma, which is produced anyway with sputtering, can be used to carry out the process. The coupling of the substrate or the cooling roller 8 used for the coating of plastic sheets 6 to the voltage source 22a; 22b corresponds to the coupling as was shown in FIG. 5a for the use of magnetrons as the plasma source. The variant shown in FIG. 5b would likewise be usable, while the variant shown in FIG. 5 is less favorably suited for this due to the asymmetry of the two magnetrons.

What is claimed is:

1. A process for ion-supported vacuum coating, for a high-rate coating of a substrate comprising at least one of a large-surfaced, electrically conductive or electrically insulating substrate with an electrically insulating coating and of an electrically insulating substrate with an electrically conductive coating, in which a plasma is produced between a coating source and the substrate to accelerate ions toward the substrate, said method comprising:

applying alternating negative and positive voltage pulses relative to a plasma potential to one of an electrically conductive substrate or to an electrode disposed directly behind an electrically insulating substrate and extending over an entire substrate, wherein a duration of the negative voltage pulses corresponds to a charging time of capacitor formed by at least one of the electrically insulating coating and the electrically insulating substrate;

choosing a duration of the positive voltage pulses to be equal to or less than the duration of the negative voltage pulses, wherein the positive and negative voltage pulses follow one another in direct succession and are set at virtually a same level relative to the plasma potential, and wherein the level of the positive and negative voltage pulses, relative to the plasma potential, is approximately between ±20 to ±2000 V.

2. The process according to claim 1, further comprising adjusting the duration of the negative voltage pulses to between approximately 1 ms to 10 μs when at least one of an insulating coating thickness and substrate thickness is between approximately 1 μm to 100 μm.

3. The process according to claim 1, further comprising applying rectangular voltage pulses to one of the electrically conductive substrate or the electrode behind the electrically insulating substrate;

selecting a large rise time of the positive voltage pulses and a large fall time of the negative voltage pulses so that surface potential of deposited coating is not increased at any point in time more than 20 V positive relative to the plasma potential; and selecting a small rise time of the negative voltage pulses and a small fall time of the positive voltage pulses so that the surface potential of the deposited coating is increased for a short time to a negative value of at least 50 percent a doubled pulse level relative to the plasma potential.

4. The process according to claim 1, further comprising applying sine-shaped voltage pulses to one of the electrically conductive substrate and the electrode behind the electrically insulating substrate and adjusting the durations of the positive and negative voltage pulses to be equal in length.

5. The process according to claim 1, further comprising utilizing an electron beam evaporator as a coating source, and producing the plasma by ionizing vapor and residual gas with an electron beam and electrons backscattered at the evaporating material.

6. The process according to claim 1, further comprising utilizing at least one arbitrarily heated evaporator as a coating source, and producing the plasma by low-voltage arc discharges in the region between the at least one arbitrarily heated evaporator and substrate.

7. The process according to claim 6, further comprising utilizing at least one resistance-heated boat evaporator as the coating source, and producing the plasma by hollow-cathode arc discharges in the region between the at least one evaporator and the substrate.

8. The process according to claim 1, further comprising utilizing at least one arbitrarily heated evaporator as the coating source, and producing the plasma by a magnetron discharge between two magnetrons which burn counter to each other with a chronologically alternating polarity.

9. The process according to claim 1, further comprising utilizing at least one sputtering source as a coating source, the at least one sputtering source simultaneously producing the plasma.

10. The method according to claim 1, the level of the positive and negative voltage pulses, relative to the plasma potential, is approximately between ±50 to ±500 V.

11. The method according to claim 1, choosing the duration of the positive voltage pulses such that the duration of the negative voltage pulses are between approximately 2 to 10 times greater than the chosen duration positive voltage pulses.

* * * * *